United States Patent
Lin et al.

(10) Patent No.: US 10,262,869 B2
(45) Date of Patent: Apr. 16, 2019

(54) PLANARIZATION METHOD

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Jen-Chieh Lin, Kaohsiung (TW); Lee-Yuan Chen, Taichung (TW); Wen-Chin Lin, Tainan (TW); Chi-Lune Huang, Tainan (TW); Pi-Hung Chuang, Changhua County (TW); Tai-Lin Chen, Kaohsiung (TW); Sun-Hong Chen, Taipei (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/904,405

(22) Filed: Feb. 25, 2018

(65) Prior Publication Data
US 2018/0277382 A1    Sep. 27, 2018

(30) Foreign Application Priority Data
Mar. 24, 2017  (CN) .......................... 2017 1 0180563

(51) Int. Cl.
| | | |
|---|---|---|
| H01L 21/3105 | (2006.01) | |
| H01L 21/308 | (2006.01) | |
| H01L 21/768 | (2006.01) | |
| H01L 21/321 | (2006.01) | |

(52) U.S. Cl.
CPC ...... *H01L 21/31055* (2013.01); *H01L 21/308* (2013.01); *H01L 21/31053* (2013.01); *H01L 21/31056* (2013.01); *H01L 21/3212* (2013.01); *H01L 21/76802* (2013.01)

(58) Field of Classification Search
USPC .................................................. 438/692, 693
See application file for complete search history.

(56) References Cited

U.S. PATENT DOCUMENTS 8,580,690 B2    11/2013    Busch

*Primary Examiner* — Roberts P Culbert
(74) *Attorney, Agent, or Firm* — Winston Hsu

(57) ABSTRACT

A planarization method includes providing a substrate having a semiconductor structure formed thereon. A dielectric layer is formed on the substrate, and a mask layer is formed on the dielectric layer. A first chemical mechanical polishing process is performed to remove a portion of the mask layer thereby forming an opening directly over the semiconductor structure and exposing the dielectric layer. A first etching process is performed to anisotropically remove a portion of the dielectric layer from the opening. The mask layer is then removed and a second chemical mechanical polishing process is then performed.

12 Claims, 5 Drawing Sheets

US 10,262,869 B2

PLANARIZATION METHOD

BACKGROUND OF THE INVENTION

1. Field of the Invention

The present invention relates to the field of a semiconductor manufacturing process. More particularly, the present invention relates to a planarization method for planarizing a surface during the process of manufacturing a semiconductor device.

2. Description of the Prior Art

Dynamic random access memory (DRAM) is one kind of volatile memory. A DRAM device usually includes an array region comprising plural memory cells and a peripheral region comprising control circuit. Generally, each memory cell has a transistor electrically coupled with a capacitor (1T1C). A digital data is stored in a memory cell by charging or discharging of the capacitor.

In advanced technology node of semiconductor manufacturing, the dimension of a memory cell has been miniaturized by adopting three-dimensional structure. For example, a memory cell having a capacitor (also known as crown-type capacitor) formed vertically stacked on the transistors and having the electrode extending upwardly may occupy a much smaller area of the substrate and may have more flexibility in adjusting the capacitance for different applications. For instance, the overall capacitance of a crown-type capacitor may be increased simply by increasing the height therefore increasing the overlapping area of the electrodes and the capacitance of the capacitor is increased.

However, the height of the crown-type capacitor may cause a large step height of a dielectric layer between the array region and the peripheral region and may adversely increase the difficulty of planarizing the dielectric layer. Furthermore, defects such as surface scratch defects may arise when planarizing the dielectric layer having large step height. Therefore, there is still a need in the field to provide an improved planarization method which is able to effectively remove the large step height and reduce the risk of surface scratching, thereby obtaining an ideal planar top surface.

SUMMARY OF THE INVENTION

One objective of the present invention is to provide a method of planarizing a surface during the process of manufacturing a semiconductor device that may have reduced defects and better planarity.

According to one aspect of the present invention, a planarization method including the following steps is provided. A substrate having a semiconductor structure formed thereon is provided. A dielectric layer is formed completely covering the substrate and the semiconductor structure, wherein a portion of the dielectric layer covering the semiconductor structure has a first top surface, and a portion of the dielectric layer not covering the semiconductor has a second top surface. A mask layer is formed conformally covering on the dielectric layer. A first chemical mechanical polishing process is performed to remove a portion of the mask layer directly over the semiconductor structure thereby forming an opening exposing the dielectric layer. Subsequently, an etching process is performed to remove a portion of the dielectric layer from the opening until a third top surface is obtained. After that, the mask layer is removed and a second chemical mechanical polishing process is performed.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

DETAILED DESCRIPTION

In the following description, numerous specific details are given to provide a thorough understanding of the invention. It will, however, be apparent to one skilled in the art that the invention may be practiced without these specific details. Furthermore, some system configurations and process steps are not disclosed in detail, as these should be well-known to those skilled in the art. Other embodiments may be utilized and structural, logical, and electrical changes may be made without departing from the scope of the present invention.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Please refer to FIG. 1 to FIG. 5, which are schematic cross-sectional drawings illustrating a planarization method in accordance with a first embodiment of the present invention.

Figure 1:
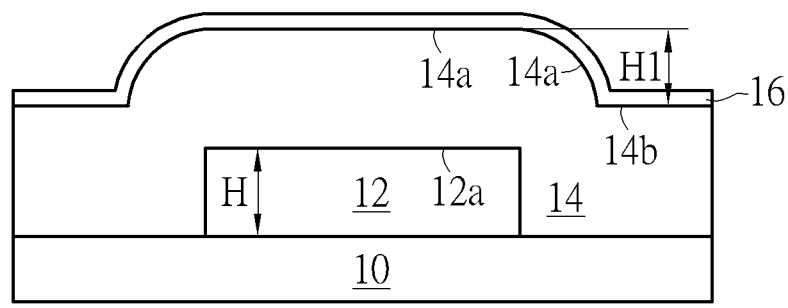
FIG. 1 to FIG. 5 are schematic cross-sectional drawings illustrating a planarization method in accordance with a first embodiment of the present invention.

Please refer to FIG. 1. A substrate 10 having a semiconductor structure 12 formed thereon is provided. The substrate 10 may include any substrate a device may be formed therein or a layer may be deposited thereon to form the integrated circuit (IC) structure. The substrate 10 maybe a silicon substrate, silicon-on-insulator (SOI) substrate, or substrates made of semiconductor materials such as germanium, gallium arsenide, indium phosphide, but not limited hereto. According to the embodiment, the substrate 10 is a substrate for forming a dynamic random access memory (DRAM) and may have a plurality of transistors (not shown) formed therein. The substrate 10 may further comprise a plurality of orthogonal word lines (not shown) and bit lines (not shown) formed therein to access each of the transistors. The semiconductor structure 12 may comprise a group of crown-type capacitors formed directly stacking on an array region of the DRAM and may have a height (analogous to a thickness) H. According to an embodiment, the height H of the semiconductor structure 12 may be between 1.5 micrometers and 2 micrometers. In other embodiments, the height H of the semiconductor structure 12 may be even higher for obtaining larger capacitance. The planarization method provided by the present invention may be applied in the manufacturing process of forming other semiconductor devices and is not limited to the illustrated exemplary embodiment of forming a dynamic random access memory.

Please still refer to FIG. 1. Subsequently, a dielectric layer 14 is deposited completely covering the substrate 10 and the semiconductor structure 12. A mask layer 16 is then formed completely covering the dielectric layer 14. The dielectric layer 14 maybe made of silicon oxide and preferably deposited in a thickness larger than the height H of the semiconductor structure 12. According to a preferred embodiment, the dielectric layer 14 may have a thickness approximately twice the height H of the semiconductor structure 12 to ensure a sufficient thickness being removed during the following planarization process. For example, when the height H of the semiconductor structure 12 is between 1.5 micrometers and 2 micrometers, the thickness of the dielectric layer 14 is more preferably between 3 micrometers and 4 micrometers. The height H of the semiconductor structure 12 causes the dielectric layer 14 to have a non-planar surface topography, including a high topography region of the dielectric layer 14 covering on the semiconductor structure 12 and having a first top surface 14a and a low topography region of the dielectric layer 14 not covering the semiconductor structure 12 having a second top surface 14b. There is an obvious step height H1 between the first top surface 14a and the second top surface 14b. According to an embodiment when the dielectric layer 14 is deposited in a conformal manner, the height of the step height H1 shown in the non-planar surface topography of the dielectric layer 14 is approximately the same with the height H of the semiconductor structure 12, that is, between 1.5 micrometers and 2 micrometers. As previously noted, the thickness of the dielectric layer 14 is preferably larger than the height H of the semiconductor structure 12, and therefore the second top surface 14b of the dielectric layer 14 would be at a horizontal level higher than a top surface 12a of the semiconductor structure 12. The mask layer 16 formed on the dielectric layer 14 conformally reproduces the non-planar surface topography of the dielectric layer 14. The mask layer 16 is made of a material having significant etching selectivity with respect to the dielectric layer 14. For example, when the dielectric layer 14 is made of silicon oxide, the mask layer 16 may preferably comprise silicon nitride, or the like. The thickness of the mask layer 16, for example, may range between 200 angstroms and 300 angstroms.

Figure 2:
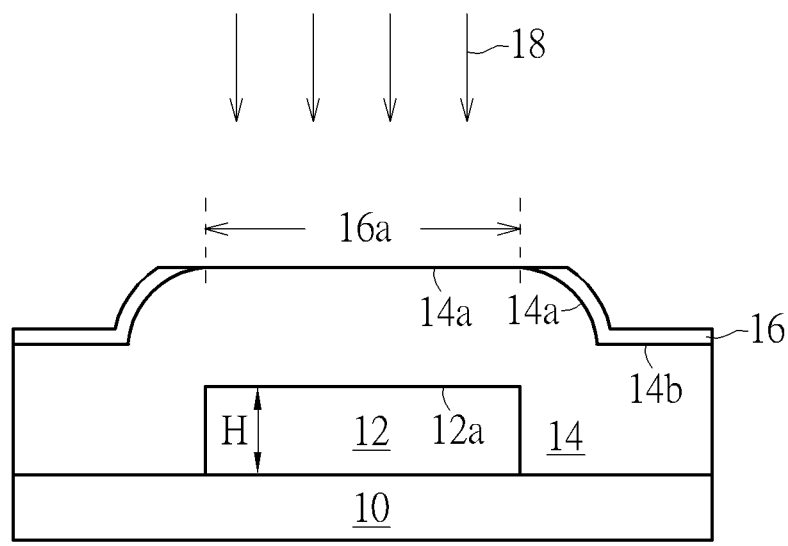

Please refer to FIG. 2. A portion of the mask layer 16 covering on the high topography region of the dielectric layer 14 is then selectively removed to form an opening 16a directly over the semiconductor structure 12 and exposing a portion of the first surface 14a of the high topography region of the dielectric layer 14. As shown in FIG. 2, the other portion of the mask layer 16 is not removed and does not expose any other portion of the dielectric layer 14. Preferably, the opening 16a may be performed by performing a first chemical mechanical polishing process 18. The step height H1 which is usually considered a troublesome problem in conventional planarization processes is turned into an advantage when performing the first chemical mechanical polishing process 18, allowing the first chemical mechanical polishing process 18 being able to form the opening 16a precisely over the semiconductor structure 12 by selectively removing a portion of the mask layer 16. More specifically, during the first chemical mechanical polishing process 18, the mask layer 16 directly over the semiconductor structure 12 may bear a significantly higher degree of downforce than the other portion of the mask layer 16 and consequently has a much higher removal rate and may be removed in a highest priority among other portions of the mask layer 16 during the first chemical mechanical polishing process 18. In other words, the opening 16a may be formed conveniently by simply performing the first chemical mechanical polishing process 18. It should be understood that in other embodiments, the opening 16a may be formed by performing a conventional photolithography-etching process.

Figure 3:
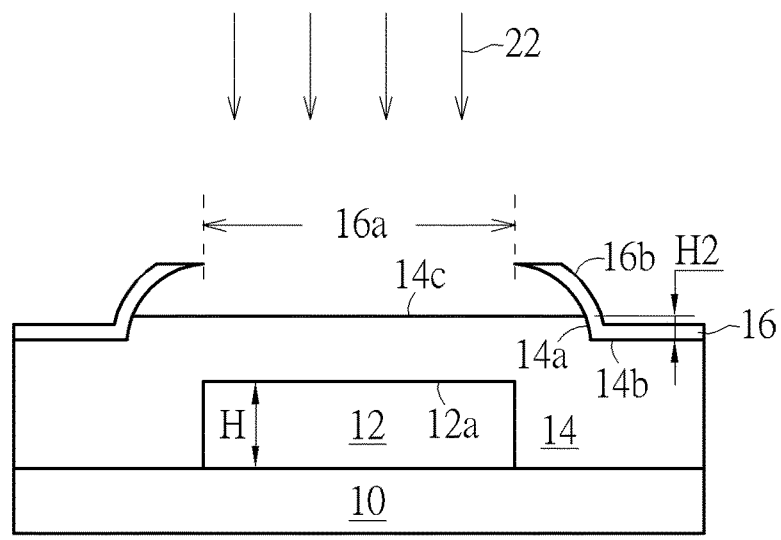

Please refer to FIG. 3. After forming the opening 16a, an etching process 22 using the mask layer 16 as an etching mask is performed to isotropically remove a portion of the dielectric layer 14 from the opening 16a until a third top surface 14c of the dielectric layer 14 is obtained. The etching process 22 preferably has significant etching selectivity between the mask layer 16 and the dielectric layer 14. For example, when the dielectric layer 14 comprises silicon oxide and the mask layer 16 comprises silicon nitride, the etching process 22 is preferably a wet etching process using hydrofluoric acid (HF) as a primary etchant which removes silicon oxide much faster than removing silicon nitride. The etching process 22 selectively and isotropically etches away a portion of the dielectric layer 14 from the opening 16a until a pre-determined thickness of the dielectric layer 14 covering on the semiconductor structure 12 is obtained. After the etching process 22, as shown in FIG. 3, the third top surface 14c of the dielectric layer 14 is at a horizontal level higher than the second top surface 14b and has a step height H2 between the second top surface 14b. According to an embodiment, the step height H2 may range between 500 angstroms and 2000 angstroms. Another feature of the present invention is that the etching process 22, specifically, is a wet etching process used to remove the dielectric layer 14 from the opening 16a in an isotropic manner. The dielectric layer 14 covered by a tip portion 16b of the mask layer 16 around the opening 16a may also be removed laterally from the opening 16a, leaving the tip portion 16b of the mask layer 16 protruding and suspending from the perimeter of the third top surface 14c, and forming the third top surface 14c having an area larger than the area of the opening 16a. The third top surface 14c is substantially planar according to a preferred embodiment.

In a conventional planarization process for planarizing a large step height of a dielectric layer, an etching back process, a dry etching process is usually performed before performing the chemical mechanical process to reduce the step height between the high topography region and the low topography region. During the etching back process, the low topography region of the dielectric layer is covered by a mask layer and the high topography region of the dielectric layer is etched from an opening of the mask layer in an anisotropic manner. The mask layer is then removed and a subsequent chemical mechanical polishing process is performed on the dielectric layer to level the remaining step height. However, a defect problem is raised from the conventional planarization. The mask layer covering the low topography region of the dielectric layer may extend to cover a peripheral portion of the high topography region to ensure that none of the low topography region of the dielectric layer would be exposed to the etching back process. Consequently, a dielectric pillar may be formed in the transition region between the high topography region and the low topography region of the dielectric layer after the dry etching process. The dielectric pillar may collapse and cause surface scratch during the subsequent chemical mechanical process, and therefore resulting in yield loss. The planarization method provided by the present invention may avoid the above defect problem by using a wet etching process (the step shown in FIG. 3) to remove the dielectric layer 14 from the opening in an isotropic manner, and therefore leaving no dielectric pillar in the transition region between the high topography region and the low topography region of the dielectric layer.

Figure 4:
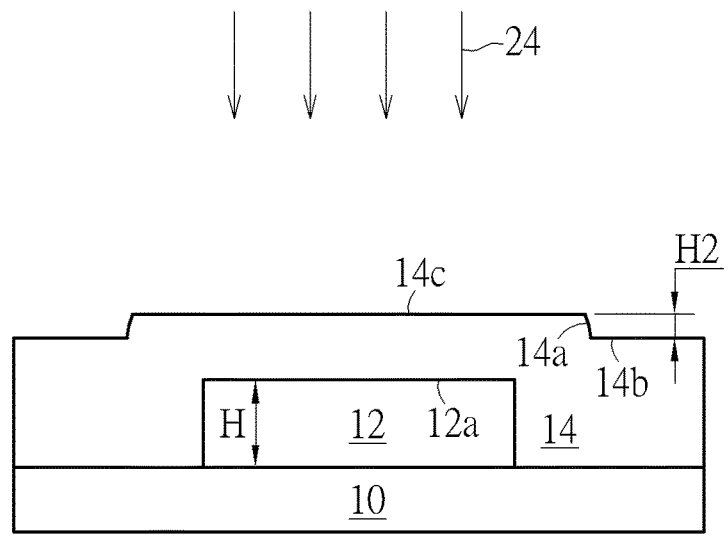

Please refer to FIG. 4. After the etching process 22, a removal process 24 is carried out to remove the mask layer 16 and completely expose the third top surface 14c, the second top surface 14b and the remaining first top surface 14a. According to an embodiment, the removal process 24 maybe a wet etching process using phosphoric acid ($H_3PO_4$) as a primary etchant, or may be a dry etching process using at least a fluorine-containing gas as a primary etchant, such as $CF_3$, $C_4F_6$ and $C_4F_8$, or the like. As shown in FIG. 4, the step height H1 of the as-deposited dielectric layer 14 has been reduced to the step height H2, for example, from 1.5 to 2 micrometers to 500 to 2000 angstroms. Most of the step height, maybe up to 90% of the original step height, has been removed before performing the subsequent second chemical mechanical polishing process 26 (shown in FIG. 5) by the etching process 22, specifically, a wet etching process.

Figure 5:
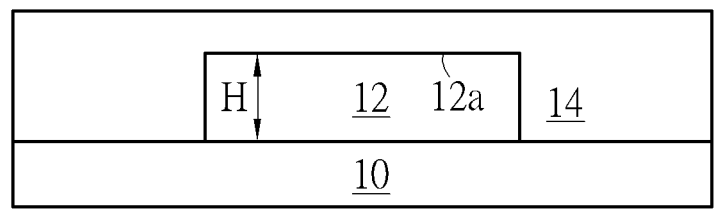
Figure 6:
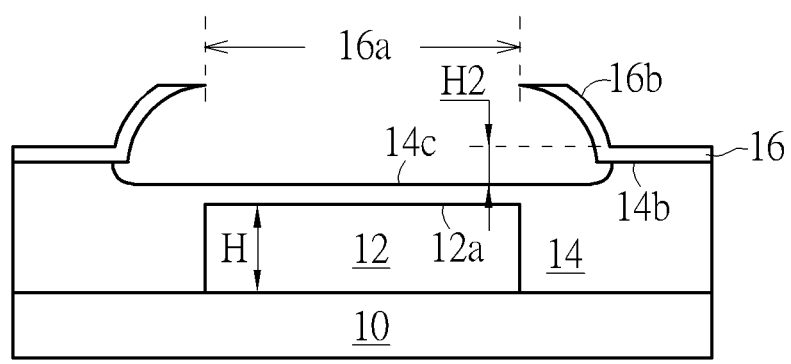
FIG. 6 is a schematic cross-sectional drawing illustrating a modification of the first embodiment which corresponds to the step shown in FIG. 3.

Please refer to FIG. 5. A second chemical mechanical process 26 is then performed on the third top surface 14c, the second top surface 14b and the remaining first top surface 14a until a planar top surface of the dielectric layer 14 is obtained without exposing any portion of the semiconductor structure. According to an embodiment, the remaining dielectric layer 14 directly over the semiconductor structure 12 is between 2500 angstroms and 3000 angstroms. Since the original micrometer-scale step height H1 has been greatly reduced to the step height H2 which is only 10% of the step height H1, the second chemical mechanical process 26 may easily remove the step height H2 in a shorter processing time and consuming a smaller thickness of the dielectric layer 14. In another embodiment when the mask layer 16 is made of a material less likely to scratch the dielectric layer 14 or having a thinner thickness, the mask layer 16 may be removed by the second chemical mechanical process 26. That is, after the etching process 22 shown in FIG. 3, the second chemical mechanical process 26 as shown in FIG. 5 is then performed to remove the mask layer 16 and polish the dielectric layer 14, and the removal process 24 shown in FIG. 4 may be omitted Please refer to FIG. 6. FIG. 6 is a schematic cross-sectional drawing illustrating a modification of the first embodiment. The step shown in FIG. 6 corresponds to the step shown in FIG. 3. The difference is that, after the etching process 22 shown in FIG. 6, the third top surface 14c of the dielectric layer 14 is at a horizontal level lower than the second top surface 14b and higher than the top surface 12a of the semiconductor structure 12. Similarly, none of the semiconductor structure 12 is exposed from the dielectric layer 14 after the etching process 22. There is also a step height H2 between the third top surface 14c and the second top surface 14b, and is preferably between 500 angstroms and 2000 angstroms. It is noteworthy that the dielectric layer 14 is laterally removed from the opening 16a until all of the first top surface 14a removed and therefore the third top surface 14c is directly abutting the second top surface 14b.

After removing the mask layer 16, subsequent second chemical mechanical polishing process 26 is performed on the third top surface 14c and the second top surface 14b of the dielectric layer 14 to remove the step height H2 thereby obtaining a planar top surface of the dielectric layer 14.

FIG. 7 to FIG. 10 are schematic cross-sectional drawings illustrating a planarization method in accordance with a second embodiment of the present invention. For the sake of simplicity, like reference numerals are used to refer to the same material layers or process steps as described in the first embodiment previously illustrated. The difference between the first embodiment and the second embodiment is that, in the step shown in FIG. 7 of the second embodiment which corresponds to the step shown in FIG. 1 of the first embodiment, the dielectric layer 14 is deposited in a thickness equal to or smaller than the height (or thickness) H of the semiconductor structure 12.

Figure 7:
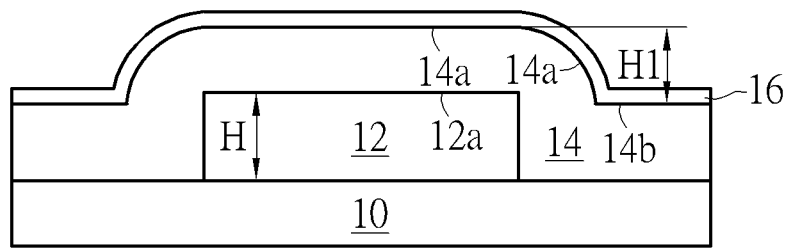
FIG. 7 to FIG. 10 are schematic cross-sectional drawings illustrating a planarization method in accordance with a second embodiment of the present invention.

Please refer to FIG. 7. Similarly, a substrate 10 is provided. A semiconductor structure 12 having a height (or thickness) H is formed on the substrate 10. A dielectric layer 14 and a mask layer 16 are successively formed conformally and completely covering the substrate 10 and the semiconductor structure 12. A high topography region of of the dielectric layer 14 covering on the semiconductor structure 12 has a first top surface 14a and a low topography region of the dielectric layer 14 covering on the substrate 10 has a second top surface 14b. There is a step height H1 between the first top surface 14a and the second top surface 14b. In the second embodiment, because the dielectric layer 14 is deposited in a thickness equal to or smaller than the height H of the semiconductor structure 12, the second top surface 14b may be at a horizontal level flush with or lower than the top surface 12a of the semiconductor structure 12.

Figure 8:
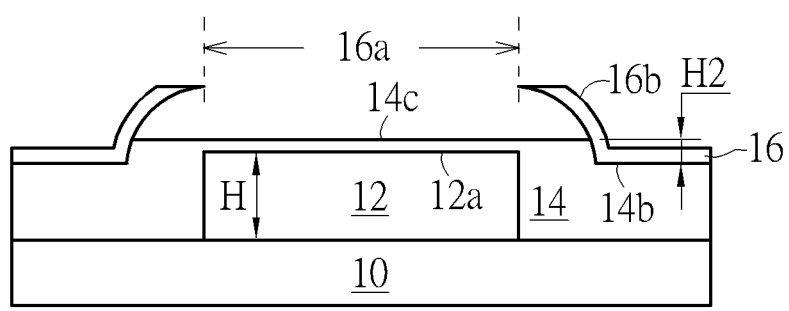

Please refer to FIG. 8. A first chemical mechanical polishing process 18 is then performed on the mask layer 16 to selectively remove a portion of the mask layer 16, thereby forming an opening 16a directly over the semiconductor structure 12 and exposing a portion of the first top surface 14a of the high topography region of the dielectric layer 14. An etching process 22 is then performed to remove a portion of the dielectric layer 14 from the opening 16a in an isotropic manner until a third top surface 14c is obtained. The third top surface 14c is at a horizontal level higher than the top surface 12 of the semiconductor structure 12 and does not expose any portion of the semiconductor structure 12. The third top surface 14c is also at a horizontal level higher than the second top surface 14b. There is a step height H2 between the third top surface 14c and the second top surface 14b.

Figure 9:
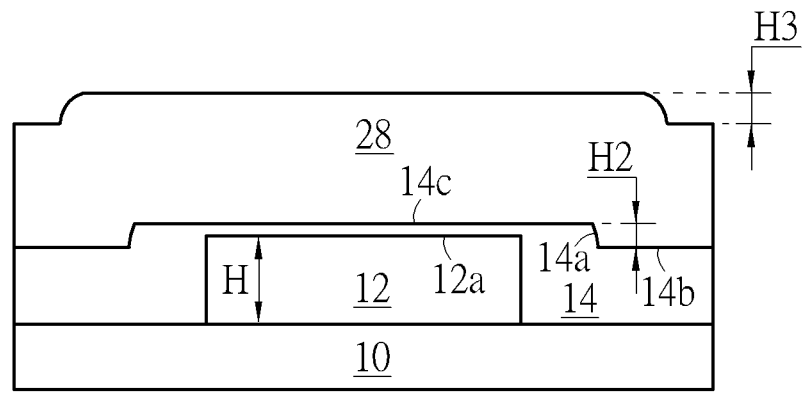

Please refer to FIG. 9. After removing the mask layer 16 and completely exposing the third top surface 14c, the second top surface 14b and the remaining first top surface 14a, a cap layer 28 is deposited completely covering the dielectric layer 14. The cap layer 28 may reproduce the surface topography of the dielectric layer 14. More particularly, the cap layer 28 may reproduce the surface topography formed by the third top surface 14c, the second top surface 14b and the remaining first top surface 14a, and consequently has a non-planar surface topography, including a step height H3 between a portion of the cap layer 28 directly over the third top surface 14c and another portion of the cap layer 28 directly over the second top surface 14b. The step height H3 may have the same height as the step height H2. According to an embodiment, the cap layer 28 may have the same material as the dielectric layer 14, such as silicon oxide.

Figure 10:
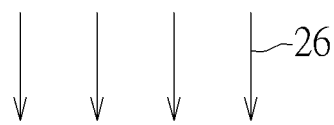
Figure 10:
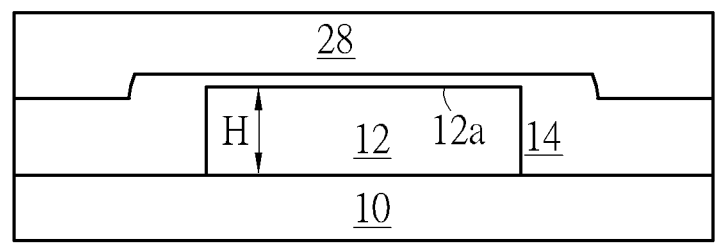

Please refer to FIG. 10. Subsequently, a second chemical mechanical polishing process 26 is carried out on the cap layer 28 to remove the step height H3 until a planar top surface of the cap layer 28 is obtained and leaving the remaining cap layer 28 and dielectric layer 14 directly over the semiconductor structure 12 having a pre-determined thickness, such as between 2500 angstroms and 3000 angstroms.

The present invention turns the large step height of the dielectric layer into an advantage which allows a chemical mechanical polishing process being able to selectively remove a portion of the mask layer thereby forming an opening precisely exposing the high topography region of the dielectric layer. The exposed dielectric layer of the high topography region is then recessed by performing an isotropic wet etching process until the aforesaid large step height is reduced to a much smaller step height, which may be removed easily in another subsequent chemical mechanical polishing process. In comparison with a conventional planarization process which may employ an additional make layer such as a photoresist layer to form the opening of the mask layer, or may employ an additional polishing stop layer along with performing a high selective chemical mechanical polishing process for obtaining the planar top surface, the planarization method provided by the present invention may have the advantages of simplified process steps, lower cost and a higher degree of planarity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A planarization method, comprising:
   providing a substrate having a semiconductor structure formed thereon;
   forming a dielectric layer covering the substrate and the semiconductor structure, wherein a portion of the dielectric layer covering the semiconductor structure has a first top surface, the other portion of the dielectric layer not covering the semiconductor structure has a second top surface;
   forming a mask layer on the dielectric layer;
   performing a first chemical mechanical polishing process to remove a portion of the mask layer thereby forming an opening directly over the semiconductor structure and exposing the dielectric layer;
   performing an etching process to anisotropically remove a portion of the dielectric layer from the opening until obtaining a third top surface of the dielectric layer;
   removing the mask layer; and
   performing a second chemical mechanical polishing process.

2. The planarization method according to claim 1, wherein the etching process is a wet etching process.

3. The planarization method according to claim 1, wherein the semiconductor structure is not exposed from the third top surface.

4. The planarization method according to claim 1, wherein the third top surface has an area larger than an area of the opening.

5. The planarization method according to claim 1, wherein a tip portion of the mask layer protrudes and suspends from a perimeter of the third top surface after the etching process.

6. The planarization method according to claim 1, wherein the first top surface is higher than the second top surface and the second top surface is higher than a top surface of the semiconductor structure.

7. The planarization method according to claim 6, wherein the third top surface is higher than the second top surface.

8. The planarization method according to claim 6, wherein the third top surface is lower than the second top surface.

9. The planarization method according to claim 1, wherein the first top surface is higher than the second top surface and the second top surface is lower than a top surface of the semiconductor structure.

10. The planarization method according to claim 9, wherein a cap layer is formed on the dielectric layer after removing the mask layer and before performing the second polishing process.

11. The planarization method according to claim 1, wherein a removal process is performed to remove the mask layer.

12. The planarization method according to claim 1, wherein the mask layer is removed by the second planarization process.

* * * * *